(12) United States Patent
Lenoble

(10) Patent No.: US 7,208,377 B2
(45) Date of Patent: Apr. 24, 2007

(54) SILICON OXIDATION METHOD

(75) Inventor: Damien Lenoble, Gieres (FR)

(73) Assignee: STMicroelectronics, S.A. (FR)

( * ) Notice: Subject to any disclaimer, the term of this patent is extended or adjusted under 35 U.S.C. 154(b) by 0 days.

(21) Appl. No.: 10/875,665

(22) Filed: Jun. 23, 2004

(65) Prior Publication Data
US 2004/0262682 A1    Dec. 30, 2004

(30) Foreign Application Priority Data
Jun. 30, 2003  (FR) .................... 03 50276

(51) Int. Cl.
*H01L 21/336*   (2006.01)
*H01L 21/338*   (2006.01)

(52) U.S. Cl. .................... 438/265; 438/185; 438/305; 438/595

(58) Field of Classification Search ........ 438/180–185, 438/230–232, 265, 301–303, 305, 306, 595; 257/900
See application file for complete search history.

(56) References Cited
U.S. PATENT DOCUMENTS
6,943,098 B2 * 9/2005 Yeh et al. .................... 438/525

FOREIGN PATENT DOCUMENTS
DE    10062494 A1    5/2002
JP    2000269496     9/2000

OTHER PUBLICATIONS
French Search Report, FR 0350276, Mar. 12, 2004.

* cited by examiner

*Primary Examiner*—Hung Vu
(74) *Attorney, Agent, or Firm*—Lisa K. Jorgenson; Graybeal Jackson Haley LLP; Paul F. Rusyn

(57) ABSTRACT

A method for forming, by thermal oxidation, a silicon oxide layer on an integrated circuit including three-dimensional silicon patterns, includes implanting a first element according to a first angle with respect to a horizontal direction. The first element is electrically neutral and has a first effect on the growth rate of a thermal oxide on silicon. A second element is implanted according to a second angle with respect to the horizontal direction. The second element is electrically neutral and has a second effect complementary to the first effect on the growth rate of a thermal oxide on silicon. The second angle is distinct from the first angle, and one of the first and second angles is a right angled. The silicon is thermally oxidized.

21 Claims, 2 Drawing Sheets

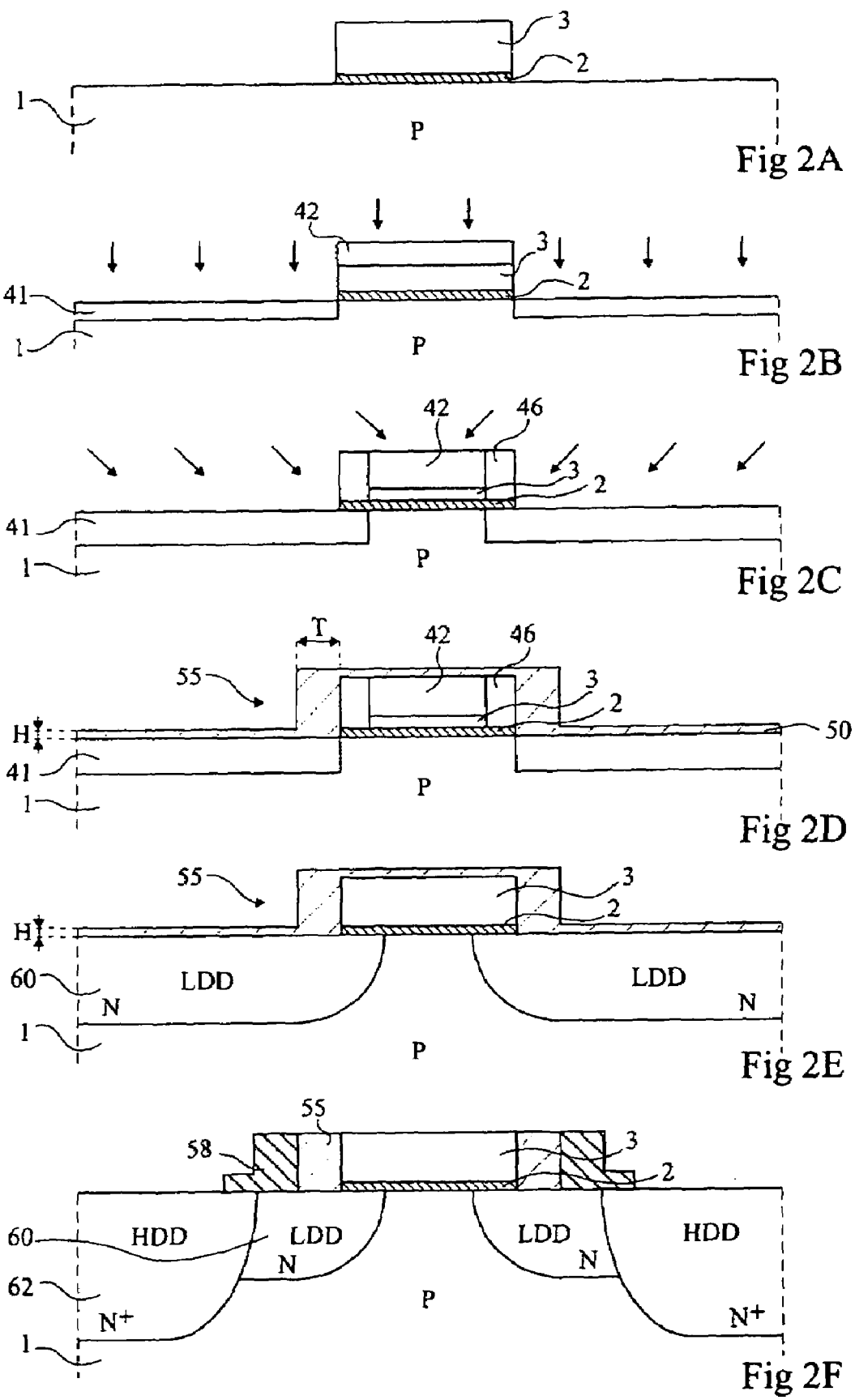

SILICON OXIDATION METHOD

PRIORITY CLAIM

This application claims priority from French patent application no. 03/50276, filed Jun. 30, 2003, which is incorporated herein by reference.

BACKGROUND

1. Technical Field

The present invention generally relates to the manufacturing of integrated circuits. More specifically, the present invention relates to a method for oxidizing three-dimensional silicon patterns of very small dimensions.

2. Discussion of the Related Art

"Patterns of very small dimensions" is here used to designate elements in relief having at least one dimension—their width or their length—smaller than 100 nm. Insulated gates of MOS type transistors are considered hereafter as a non-limiting example of such three-dimensional patterns, the gate length being smaller than 100 nm.

FIGS. 1A to 1D illustrate, in simplified partial cross-section view, different steps of a known method for forming a MOS transistor in a P-type doped single-crystal silicon substrate 1.

As illustrated in FIG. 1A, a thin insulating layer 2 is first formed, after which a polysilicon layer 3 is deposited. Layers 3 and 2 are then successively etched according to a same pattern, to define the insulated gate of the transistor. Gate 2-3 is defined to have a length GL of at most 100 nm.

At the next steps, illustrated in FIG. 1B, an insulating layer, generally a multilayer 4 comprising a silicon oxide ($SiO_2$) internal portion 5 and a silicon nitride ($Si_3N_4$) external portion 6, is formed. Internal portion 5 generally results from a thermal oxidation of the silicon forming gate electrode 3, followed by the deposition of a silicon oxide layer. External portion 6 results from the deposition of a silicon nitride layer.

Then, as illustrated in FIG. 1C, multilayer 4 is anisotropically etched to only be left in place on the sides of gate 2-3. First so-called offset spacers 7 are thus formed, which extend gate length GL by a value w. Spacers 7 are then used as a mask upon forming, in substrate 1, of lightly-doped source/drain regions (LDD) 8 by implantation of N-type dopants. The constraints resulting from the forming of first spacers 7 and their function will be discussed hereafter.

At the next steps, illustrated in FIG. 1D, at least one insulating layer is deposited and anisotropically etched, so that second spacers 10 are formed on either side of gate 2-3. Then, heavily-doped N-type source drain regions 13 (HDD) are formed in LDD regions 8. In this implantation, spacers 10 are used as masks.

Such a method and the resulting structures have disadvantages linked to offset spacers 7.

In technologies with a short gate length (GL<100 nm), the first spacers avoid for LDD regions 8 to join in the portion of substrate 1 underlying insulated gate 2-3. This risk is significant due to the fact that the forming of LDD regions 8 of a junction depth of at most 20 nm is delicate.

The forming of first spacers 7 results from a compromise between various constraints. In particular, spacers 7 must have an accurately determined length w/2, smaller than 20 nm, preferably on the order of from 5 to 10 nm. If length w/2 is too short, there is an overlapping between the two LDD regions 8 and the transistor source and drain are short-circuited. Conversely, if length w/2 is too long, length CL of the channel is too long and the transistor exhibits inferior electric performance, especially with a high on-state resistance.

The desired accuracy cannot be obtained with the method of FIGS. 1A to 1C, especially since length w/2 depends on the anisotropic etch methods used (FIGS. 1B–1C) to define spacers 7. These methods are poorly controlled and result in the forming of inhomogeneous spacers. Indeed, on the one hand, it is not known to remove the planar portions of multilayer 4 without etching or overetching its vertical portions intended to form spacers 7. Such an overetching reduces length w/2 of spacers 7 with respect to the initial thickness of multilayer 4. Such an overetching is not necessarily symmetrical for a given transistor and, further, when the density of formed transistors is significant, it is inhomogeneous for the different transistors.

The problem described hereabove for transistor gates is more generally encountered as soon as a thin oxide layer is desired to be formed on silicon patterns while the pattern density is very high.

SUMMARY

An aspect of the present invention aims at providing a silicon pattern oxidation method that enables accurate control of the oxide thicknesses formed on the different pattern portions.

An aspect of the present invention aims at providing such a method which enables control of the dimensions of the first spacers of MOS transistor gates of a length smaller than 100 nm.

According to an aspect of the present invention, the present invention provides a method for forming, by thermal oxidation, a silicon oxide layer on an integrated circuit comprising three-dimensional silicon patterns, comprising the steps of:

implanting a first element according to a first angle with respect to the horizontal direction, the first element being electrically neutral and having a first effect on the growth rate of a thermal oxide on silicon;

implanting a second element according to a second angle with respect to the horizontal direction, the second element being electrically neutral and having a second effect complementary to the first effect on the growth rate of a thermal oxide on silicon, the second angle being distinct from the first angle, and one of the first and second angles being a right angle; and thermally oxidizing the silicon.

According to an embodiment of the present invention, the first effect is a slow-down effect, the second effect being an acceleration effect.

According to an embodiment of the present invention, the first element is nitrogen and the second element is argon.

According to an embodiment of the present invention, the implantation according to a right angle is performed by placing the integrated circuit in a plasma of the element to be implanted.

According to an embodiment of the present invention, the implantations of the first and second elements are performed by bombarding of the integrated circuit in an implanter.

According to an embodiment of the present invention, the implanted regions of the patterns and of the circuit comprise concentrations of the first and/or second elements smaller than $10^{16}$ at/$cm^3$.

According to an embodiment of the present invention, the concentrations of the first and/or second elements range between $5.10^{14}$ and $3.10^{15}$ at/cm$^3$.

According to an embodiment of the present invention, the implanted regions of the patterns and of the circuit comprising the first and/or second elements have a depth of at most from 5 to 30 nm.

The present invention also provides a method for forming a MOS transistor in a silicon substrate of a first conductivity type, comprising the steps of:
 defining an insulated polysilicon gate on the substrate;
 performing an oxidation according to any of the preceding embodiments to form a silicon oxide layer thicker on the gate sides than on the planar substrate and gate surfaces;
 implanting a dopant of the second conductivity type, to form on either side of the gate lightly-doped drain/source regions;
 forming spacers on the gate sides; and
 implanting a dopant of the second conductivity type, to form on either side of the gate heavily-doped drain/source regions.

The foregoing aspects, features, and advantages of the present invention will be discussed in detail in the following non-limiting description of specific embodiments in connection with the accompanying drawings.

BRIEF DESCRIPTION OF THE DRAWINGS

FIGS. 2A to 2F illustrate, in simplified partial cross-section views, different steps of a method for forming a MOS transistor according to an embodiment of the present invention.

DETAILED DESCRIPTION

Figure 1A:
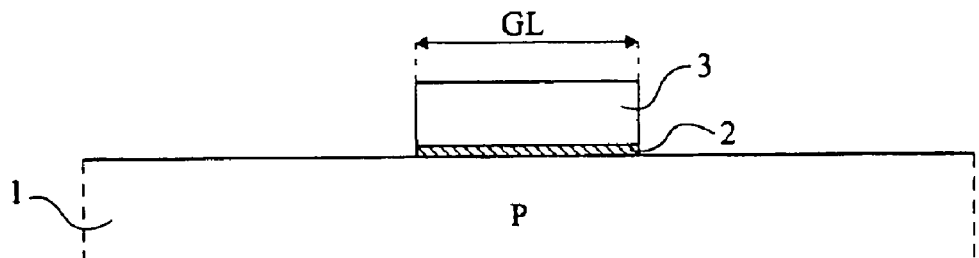
FIGS. 1A to 1D illustrate, in simplified partial cross-section views, different steps of a known MOS transistor manufacturing method.
Figure 1B:
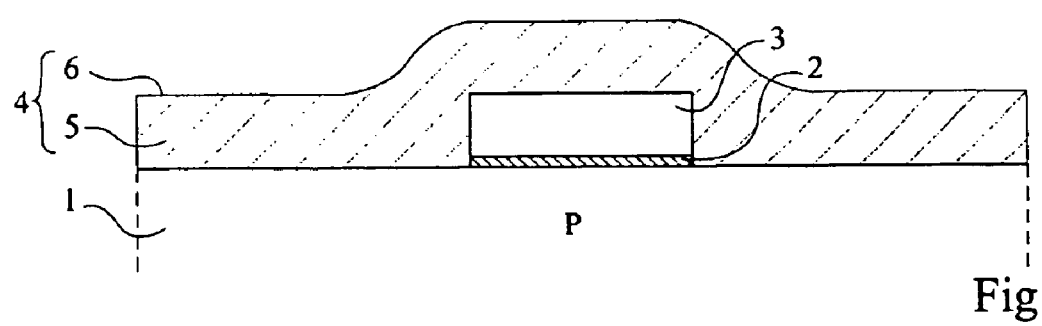

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

For clarity, same elements have been referred to with same reference numerals and further, as usual in the representation of integrated circuits, the various drawings are not to scale.

FIGS. 2A to 2F illustrate, in partial simplified cross-section views, different steps of a MOS transistor manufacturing method according to an embodiment of the present invention.

As illustrated in FIG. 2A, the method according to an embodiment of the present invention starts with the definition of the transistor's insulated gate comprising a thin insulator 2 and a polysilicon layer 3 on a doped silicon substrate 1 of a first conductivity type, for example, type P.

At the next steps, illustrated in FIG. 2B, an implantation of a first element, according to a first angle with respect to the horizontal direction, is performed.

The first angle is chosen to implant the first element in majority, if not exclusively, in certain given horizontal or vertical portions of the three-dimensional patterns. For example, the first angle is straight. Then, the first element is implanted perpendicularly, that is, only in the planar surfaces of substrate 1 and of gate 3, with the vertical surfaces, such as the lateral walls of gate 2-3, not being implanted. Regions 41 and 42 are thus formed at the surface of substrate 1 and of gate 2-3, respectively.

The first element is chosen according to the two following criteria. First, it must be electrically neutral, that is, affect neither the insulating character, nor the conductive character, no more than the conductivity type of the material in which it is implanted. Thus, region 41 remains of conductivity type P of substrate 1 in which it is formed. Second, it must have a given effect upon the growth rate of a thermal oxide on a silicon region on which it has been implanted. For example, the first element is nitrogen which has a slow-down effect.

The implantation is carried out so that the nitrogen concentration in regions 41 and 42 is smaller than $10^{16}$ atoms/cm$^3$, preferably on the order of from $5.10^{14}$ to $3.10^{15}$ atoms/cm$^3$. Further, regions 41 and 42 extend, from the respective upper surface of substrate 1 or of gate 3, down to a depth of at most from 5 to 30 nm.

At the next steps illustrated in FIG. 2C, an implantation of a second element according to a second angle with respect to the horizontal direction is performed.

The second element is selected on the basis of the two following criteria. First, like the first element, the second element must be electrically neutral. Second, it must have an effect complementary to the effect of the first element in terms of oxide growth. For example, the second element has an effect accelerating the silicon oxide thermal growth. The second element will be xenon or, preferably, argon.

The second angle is selected to be different from the first angle, to implant the second element in majority—if not exclusively—in the portions of the three-dimensional patterns that do not comprise (or comprise it in minority) the first element. For example, the implantation is an oblique implantation intended to implant the argon in majority in the side of gate 2-3. Thus, regions 46 comprising less than $10^{16}$ atoms/cm$^3$, preferably from $5.10^{14}$ to $3.10^{15}$ atoms/cm$^3$ of argon, are formed in the sides of gate 2-3.

At the next step, illustrated in FIG. 2D, the structure of FIG. 2C is placed in an oxidizing and heated atmosphere capable of causing the growth of a silicon oxide layer 50 on the exposed silicon portions. Thus, the growth of the oxide layer is performed in differential and controlled fashion. The thickness of layer 50 varies according to the areas 41, 42, and 46 on which it grows in predetermined fashion due to the nitrogen and argon concentrations that they comprise. In the considered example, layer 50 reaches a first thickness T on the sides of gate 2-3 and a second thickness H on the planar portions of substrate 1 and of gate electrode 3, first thickness T being greater than second thickness H. The values of thicknesses T and H are homogeneous for all the gates formed on the substrate. First spacers 55 are thus formed on the sides of gate 2-3, the dimensions of which are controlled.

For clarity, the first and second elements being electrically neutral, regions 41, 42, and 46 containing them are no longer shown in FIGS. 2E and 2F.

At the next steps, illustrated in FIG. 2E, a dopant capable of forming, on either side of insulated gate 2-3, lightly-doped drain-source regions LDD 60, for example of type N, is implanted. As a non-limiting example, it is considered that the difference in the respective oxide growth rates on regions 41, 42, and on regions 46 is such that thickness H of the planar portions of layer 50 is sufficiently small, between 1 and 5 nm, for these planar portions to be able to be maintained in place upon the implantation intended for the forming of LDD regions 60.

Figure 1C:
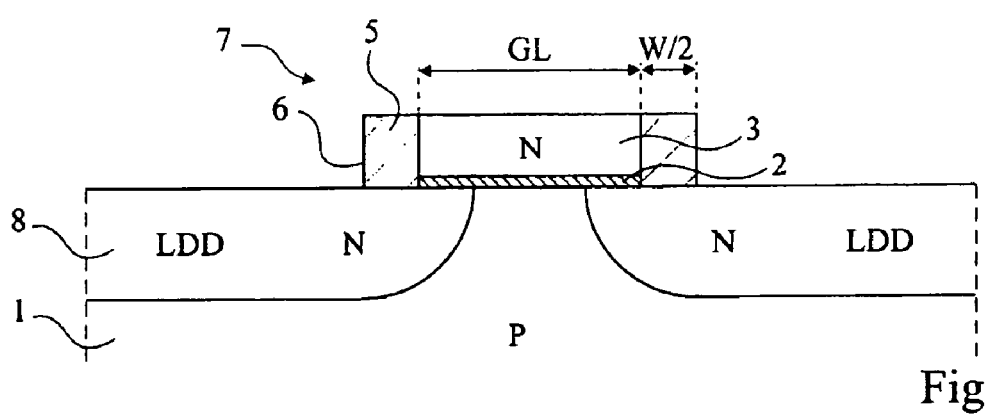
Figure 1D:
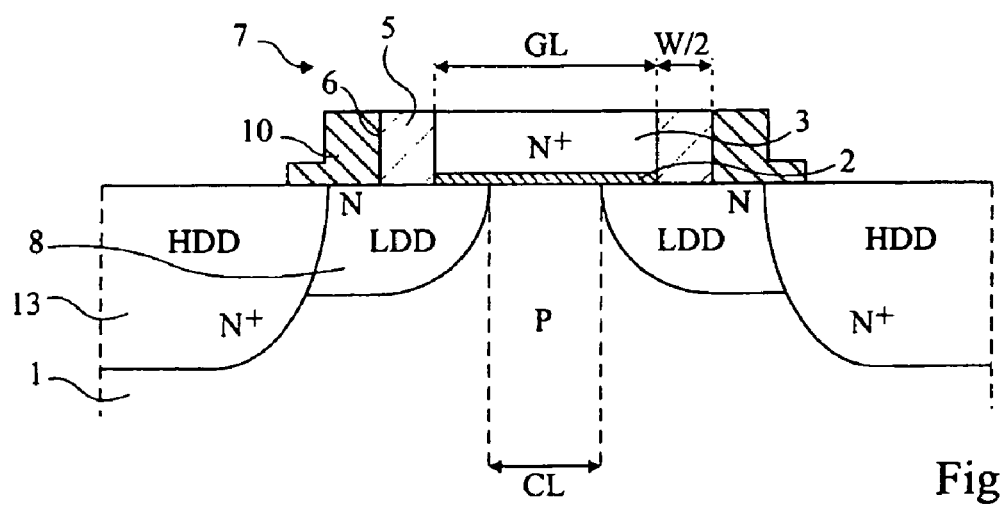

Then, as illustrated in FIG. 2F, similarly to what has been described in relation with FIG. 1D, the planar portions of layer 50 are removed. At least one insulating layer, for example, a silicon oxide layer, is deposited and etched to form second spacers 58 on either side of gate 2-3. A dopant capable of forming in substrate 1 heavily-doped (HDD) drain/source regions 62, for example, of type N, is then implanted.

The method according to this embodiment carries on with standard transistor and/or integrated circuit forming steps in a semiconductor substrate such that, for example, the forming of contacts, metallizations and passivation layers.

This embodiment of the present invention advantageously enables accurate definition of thickness T of first spacers 55. This enables overcoming the above-described disadvantages.

In particular, this embodiment of the present invention enables accurate definition of thickness T even in the case where a great number of three-dimensional patterns are present at the integrated circuit surface.

Another advantage of this embodiment of the present invention is to enable suppression of the deposition and etch steps linked to the conventional forming of the first spacers.

Of course, embodiments of the present invention are likely to have various alterations, modifications, and improvements which will readily occur to those skilled in the art. In particular, the present invention has been described in the case of a differential oxidation of the sides of an insulated polysilicon gate with respect to a single-crystal silicon surface. However, the present invention applies to the differential oxidation of any three-dimensional silicon pattern. Thus, the pattern may be a trench formed in a single-crystal silicon area. The method according to the described embodiment of the present invention then enables differentiating silicon oxide thicknesses at the bottom and on the walls of the trench. The pattern may also be a polysilicon line, insulated or not, directly formed on a substrate or not.

Further, the embodiments of the present invention have been described in the case of the forming of a silicon oxide layer which is thicker on the lateral walls of patterns than on their planar surfaces. However, it should be dear to those skilled in the art that embodiments of the present invention also apply to cases in which a thicker silicon oxide layer is desired to be formed on the planar surface of patterns than on their lateral walls. An element capable of accelerating an oxide growth is then implanted in majority in the planar surfaces, and an element capable of slowing down the oxide growth is implanted in majority in the vertical walls.

It will also be within the abilities of those skilled in the art to modify the previously-described steps according to a considered technological line. Thus, the orthogonal implantation step of FIG. 2B may be carried out either by a bombarding in an implanter, or by placing substrate 1 in a plasma containing the neutral element in ionized form.

Similarly, it has been previously considered that the planar portions of layer 50 exhibit a thickness H which is sufficiently small to be maintained in place upon forming of LDD regions 60. It should however be noted that, according to an alternative, these planar portions may be removed before implantation. Thickness H being determined in accurate and homogeneous fashion only by the concentrations of the first and second elements in regions 41 and 42 that do not depend on the density of formed transistors, the removal of the planar portions of layer 50 may be stopped more accurately than in the conventional step of removal of multilayer 4 (FIG. 1C), the thickness of which varies when the transistor density is high. Further, given the difference existing between thicknesses T and H, the etching of the planar portions of layer 50 stops before the overetching of thickness T is significant. Moreover, such a removal may then be followed by a new thermal oxidation to form a thin layer intended to protect the silicon surfaces in the subsequent dopant implantation bombarding of LDD regions 60. According to another alternative, the planar portions of layer 50 are not removed before the forming of spacers 58, but at a subsequent stage only.

Similarly, it will readily occur to those skilled in the art that the order of the implantations of the first and second elements of FIGS. 2C–D could be inverted. Thus, the vertical walls could be implanted (FIG. 2C) before implanting (FIG. 2B) the planar surfaces.

Further, the embodiments of the present invention have been described previously in the case of the forming of N-channel transistors. However, the present invention also applies to the forming of P-channel transistors. It is then particularly useful, since the boron diffusion generally used to form the P-type LDD regions diffuses more into an N-type silicon substrate than the phosphorus or arsenic generally used to form the N-type LDD regions 60 of an N-channel transistor. It is then particularly important to be able, according to an embodiment of the present invention, to form first spacers 55 which are sufficiently large to guarantee a non-zero channel length CL and sufficiently small to ensure good electric performances for the resulting transistor.

In the case of CMOS lines in which transistors with the two channel types are formed, the steps of implanting the first and second elements and of oxidizing may be simultaneous. According to an alternative, to take into account the faster diffusion of boron, only the oxidation and the orthogonal implantation, intended to slow down the oxide growth on the planar surfaces, may be performed simultaneously. However, the oblique implantation will be performed separately for the N-channel and P-channel transistors to implant greater doses of the element capable of accelerating the oxide growth in the sides of the P-channel transistor gates.

It should moreover be noted that "substrate" has been used to designate a uniformly-doped silicon wafer as well as epitaxial areas and/or areas specifically doped by implantation-diffusion formed on or in a solid substrate or a substrate-on-insulator (SOI).

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

Electronic components such as transistors that are formed according to the above described methods may be utilized in a variety of different types of integrated circuits, such as memory devices, which may be contained in a variety of different types of electronic systems, such as computer systems.

What is claimed is:

1. A method for forming, by thermal oxidation, a silicon oxide layer on an integrated circuit comprising three-dimensional silicon patterns, comprising the steps of:
   implanting a first element according to a first angle with respect to the horizontal direction, the first element being electrically neutral and having a first effect on the growth rate of a thermal oxide on silicon;

implanting a second element according to a second angle with respect to the horizontal direction, the second element being electrically neutral and having a second effect complementary to the first effect on the growth rate of a thermal oxide on silicon, the second angle being distinct from the first angle, and one of the first and second angles being a right angle; and thermally oxidizing the silicon.

2. A method for forming a MOS transistor in a silicon substrate of a first conductivity type, comprising the steps of:

defining an insulated polysilicon gate on the substrate;

forming a silicon oxide layer thicker on the gate sides than on the planar substrate and gate surfaces, the silicon oxide layer being formed by, implanting a first element according to a first angle with respect to the horizontal direction, the first element being electrically neutral and having a first effect on the growth rate of a thermal oxide on silicon;

implanting a second element according to a second angle with respect to the horizontal direction, the second element being electrically neutral and having a second effect comple-mentary to the first effect on the growth rate of a thermal oxide on silicon, the second angle being distinct from the first angle, and one of the first and second angles being a right angle; and thermally oxidizing the silicon to form the silicon oxide layer;

implanting a dopant of the second conductivity type, to form on either side of the gate lightly-doped drain/source regions;

forming spacers on the gate sides; and implanting a dopant of the second conductivity type, to form on either side of the gate heavily-doped drain/source regions.

3. The method of claim 2, wherein the first effect is a slow-down effect, and the second effect is an acceleration effect.

4. The method of claim 3, wherein the first element is nitrogen and the second element is argon.

5. The method of claim 2, wherein the implantation according to a right angle is performed by placing the transistor in a plasma of the element to be implanted.

6. The method of claim 2, wherein the implantations of the first and second elements are performed by bombarding of the transistor in an implanter.

7. The method of claim 2, wherein the implanted regions of the transistor have concentrations of the first and/or second elements smaller than $10^{16}$ at/cm$^3$.

8. The method of claim 7, wherein the concentrations of the first and/or second elements range between $5\times10_{14}$ and $3\times10_{15}$ at/cm$^3$.

9. The method of claim 2, wherein the implanted regions of the transistor comprising the first and/or second elements have a depth of at most from 5 to 30 nm.

10. A method of forming a silicon oxide layer through thermal oxidation of a silicon layer, the method comprising:

implanting a first element at a first angle into a first surface of the silicon layer, the first element increasing a growth rate in a first direction of a silicon oxide layer being grown on the first surface;

implanting a second element at a second angle into a second surface of the silicon layer, the second element decreasing a growth rate in a second direction of a silicon oxide layer being grown on the second surface; and growing silicon dioxide layers on the first and second surfaces.

11. A method of forming a silicon oxide layer through thermal oxidation of a silicon layer, the method comprising:

implanting a first element at a first angle into a first surface of the silicon layer, the first element increasing a growth rate in a first direction of a silicon oxide layer being grown on the first surface;

implanting a second element at a second angle into a second surface of the silicon layer, the second element decreasing a growth rate in a second direction of a silicon oxide layer being grown on the second surface; and growing silicon dioxide layers on the first and second surfaces; and wherein the first surface is an approximately vertical planar surface relative to an approximately horizontal planar surface corresponding to the second surface, and wherein the first direction corresponds to a horizontal direction and wherein the second direction corresponds to a vertical direction.

12. The method of claim 11 wherein the first element comprises argon and wherein the second element comprises nitrogen.

13. The method of claim 11 wherein the second angle is approximately normal to the approximately horizontal planar second surface and wherein the first angle is different than the second angle and selected to implant the first element primarily in the approximately vertical planar first surface.

14. A method of forming a MOS transistor in a silicon substrate having an approximately horizontal planar surface, comprising:

forming a gate structure on the horizontal planar surface of the substrate, the gate structure including a polysilicon layer having sidewalls;

implanting a first element into the sidewalls, the first element increasing a growth rate in a horizontal direction of a silicon oxide layer being grown on the sidewalls;

implanting a second element into horizontal planar surfaces of the substrate, the second element decreasing a growth rate of a silicon oxide layer being grown on the horizontal planar surface;

growing silicon dioxide layers on the sidewalls and horizontal planar surfaces; and forming drain and source regions in the substrate adjacent the gate structure.

15. The method of claim 14 wherein substrate has a P-type conductivity and wherein the drain and source regions have N-type conductivity.

16. The method of claim 14 wherein the drain and source regions comprise lightly-doped drain and source regions and wherein the method further includes forming heavily-doped drain and source regions in the substrate adjacent the lightly-doped drain and source regions.

17. The method of claim 16 wherein growing silicon dioxide layers on the sidewalls and horizontal planar surfaces comprises growing first spacers on the sidewalls, the first spacers having respective first thicknesses that are greater than thicknesses of respective silicon dioxide layers grown on the horizontal planar surfaces.

18. The method of claim 17 wherein forming drain and source regions in the substrate adjacent the gate structure is performed with the silicon dioxide layer grown on the horizontal planar surfaces present.

19. The method of claim 17 further comprising forming second spacers on the first spacers prior to forming the heavily-doped drain regions.

20. The method of claim 14 wherein the first element comprises argon and wherein the second element comprises nitrogen.

21. The method of claim 14 wherein the second element is implanted into the horizontal planar surface of the substrate at approximately a normal angle relative to the horizontal planar surface, and wherein the first element is implanted at an acute angle relative to a direction that is normal to the horizontal planar surface.

* * * * *

UNITED STATES PATENT AND TRADEMARK OFFICE
CERTIFICATE OF CORRECTION

| | |
|---|---|
| PATENT NO. | : 7,208,377 B2 |
| APPLICATION NO. | : 10/875665 |
| DATED | : April 24, 2007 |
| INVENTOR(S) | : Damien Lenoble |

It is certified that error appears in the above-identified patent and that said Letters Patent is hereby corrected as shown below:

Column 7 line 24 change "comple-mentary" to --complementary--
Column 7 line 53 change "$5x10_{14}$" to --$5x10^{14}$--
Column 7 line 54 change "$3x10_{15}$" to --$3x10^{15}$--

Signed and Sealed this

Fourteenth Day of August, 2007

JON W. DUDAS
*Director of the United States Patent and Trademark Office*